(12) United States Patent
Varone

(10) Patent No.: US 11,846,646 B2
(45) Date of Patent: Dec. 19, 2023

(54) METHOD AND SYSTEM FOR MEASURING PHYSICAL PARAMETERS IN A TRAMPOLINE COMPETITION

(71) Applicant: SWISS TIMING LTD, Corgémont (CH)

(72) Inventor: Laurent Varone, Bienne (CH)

(73) Assignee: SWISS TIMING LTD, Corgemont (CH)

(*) Notice: Subject to any disclaimer, the term of this patent is extended or adjusted under 35 U.S.C. 154(b) by 918 days.

(21) Appl. No.: 16/781,207

(22) Filed: Feb. 4, 2020

(65) Prior Publication Data
US 2020/0271685 A1    Aug. 27, 2020

(30) Foreign Application Priority Data
Feb. 21, 2019  (EP) .................................. 19158483

(51) Int. Cl.
*G01P 1/07*   (2006.01)
*A63B 5/11*   (2006.01)
(Continued)

(52) U.S. Cl.
CPC .................. *G01P 1/07* (2013.01); *A63B 5/11* (2013.01); *A63B 24/0084* (2013.01);
(Continued)

(58) Field of Classification Search
CPC ... G01P 1/07; G01P 15/18; A63B 5/11; A63B 24/0084; A63B 2024/0068;
(Continued)

(56) References Cited

U.S. PATENT DOCUMENTS 10,157,213 B1*  12/2018  Ausin ..................... H04W 4/38
2008/0146258 A1*  6/2008  Testone ................... H04W 8/06
                                                                455/466
(Continued)

FOREIGN PATENT DOCUMENTS

EP    2 962 736 A1    1/2016
WO   2014/098628 A1   6/2014

OTHER PUBLICATIONS

Christoph Lenk et al., "Evaluation eines Messsystems zur Bestimmung der Flugzeit und der Landepunkte im Trampolinturnen", Feb. 2018, pp. 1-16, XP055613361.
(Continued)

*Primary Examiner* — Mohamed Charioui
(74) *Attorney, Agent, or Firm* — Sughrue Mion, PLLC

(57) ABSTRACT

For the method and system (1) for measuring physical parameters, several motion sensor assemblies (2) are arranged in different positions on a trampoline (10) and activated to measure any motion over time during jumps performed by a competitor on a trampoline. Following the processing of measurements made in each sensor assembly, data signals are transmitted to a base station (25). As a result of the various measurements received over time from each sensor assembly, the base station determines a time of flight for each of the competitor's jumps, and a position of contact of the competitor on the bed (21) to award points to the competitor for the performance of a determined number of jumps during the competition.

13 Claims, 2 Drawing Sheets

(51) Int. Cl.
  *G01P 15/18* (2013.01)
  *A63B 24/00* (2006.01)
  *G01R 33/02* (2006.01)

(52) U.S. Cl.
  CPC .......... G01P 15/18 (2013.01); G01R 33/0206 (2013.01); *A63B 2024/0068* (2013.01); *A63B 2220/40* (2013.01); *A63B 2220/803* (2013.01); *A63B 2225/52* (2013.01)

(58) Field of Classification Search
  CPC .......... A63B 2220/40; A63B 2220/803; A63B 2225/52; A63B 2220/10; A63B 2220/62; A63B 2220/833; A63B 2225/50; A63B 71/0605; A63B 71/0616; A63B 71/0622; A63B 71/0669; A63B 71/0686; G01R 33/0206
  See application file for complete search history.

(56) References Cited

U.S. PATENT DOCUMENTS

| | | | |
|---|---|---|---|
| 2011/0034300 A1* | 2/2011 | Hall | A63B 24/0003 482/29 |
| 2012/0295763 A1* | 11/2012 | Lin | A63B 5/11 482/4 |
| 2015/0170530 A1* | 6/2015 | Damman | G06F 16/951 700/91 |
| 2017/0128779 A1* | 5/2017 | Howe | A61B 5/6892 |
| 2017/0144052 A1* | 5/2017 | Liang | A63B 5/11 |

OTHER PUBLICATIONS

Katja Ferger et al., "New Way of Determining Horizontal Displacement in Competitive Trampolining", Article inScience of Gymnastics Journal, Feb. 2017, pp. 303-310, XP055613364.

Search Report for EP Application 19158483.8 dated Aug. 16, 2019.

* cited by examiner

METHOD AND SYSTEM FOR MEASURING PHYSICAL PARAMETERS IN A TRAMPOLINE COMPETITION

CROSS-REFERENCE TO RELATED APPLICATIONS

This application claims priority to European Patent Application No. 19158483.8, filed on Feb. 21, 2019, the entire contents of which are incorporated herein by reference.

FIELD OF THE INVENTION

The invention concerns a method for measuring physical parameters in a trampoline competition.

The invention also concerns a system for measuring physical parameters in a trampoline competition for implementing the measuring method.

BACKGROUND OF THE INVENTION

In a trampoline competition, the athlete's time of flight from the trampoline bed and horizontal displacement can be determined for the allocation of points. It is known to make these measurements by means of lasers and photoelectric cells or by force sensors placed under the trampoline legs or by pairs of motion sensors arranged along orthogonal axes. However, these known measuring systems are difficult to set up and a lack of precision is observed.

Gymnastics on a trampoline is an Olympic discipline in which athletes must perform ten acrobatic jumps on the trampoline bed. The score or points awarded are based on difficulty, jump form, "time of flight" (ToF) from the trampoline bed and horizontal displacement from the centre of the trampoline bed.

For several years, time of flight points have been added to the overall score. The time of flight of each jump is added up and the total time spent in the air gives the time of flight points. The longer the athlete stays in the air the better the time of flight points. The International Federation of Gymnastics (FIG) requires a time of flight measurement precision of 5 ms.

Horizontal displacement at the landing point is also considered in determining the score and needs to be measured. To do so, there are various zones on the trampoline, which are demarcated by red lines on the bed. Every time that the athlete lands outside the central zone, a few deduction points are applied. Nowadays, this check is performed visually by judges arranged around the trampoline using a video recording. No automatic detection is used in competitions.

Reference can be made to WO Patent Application No. 2014/098628 A1, which discloses a trampoline and a method for measuring the activity of a person on a trampoline. At least two pairs of sensors are arranged around the trampoline to detect a transformation or deformation of the trampoline bed when it is used by the person. The two pairs of sensors are arranged on two orthogonal axes to obtain data in a Cartesian coordinate space. This sensor arrangement does not allow precise determination of any horizontal displacement on the bed or a time of flight of the person for a gymnastics trampoline competition, which is a drawback.

SUMMARY OF THE INVENTION

It is therefore an object of the invention to overcome the drawbacks of the aforementioned state of the art by proposing a method for measuring physical parameters in a trampoline competition for the automatic and precise determination of the number of jumps, the displacement of an athlete on the trampoline bed and the time of flight in order to allocate points during the competition.

To this end, the invention concerns a method for measuring physical parameters in a trampoline competition, which includes the features defined in the independent claim 1.

Specific steps of the measuring method are defined in the dependent claims 2 to 9.

One advantage of the measuring method lies in the fact that at least four motion sensor assemblies are provided, each arranged respectively for example at one corner of the trampoline, to provide, once activated and for determined periods, information about physical parameters measured during the competition. The physical parameters are notably the time of flight during the competition and any contact movement on the trampoline bed in order to determine a position in combination with the other motion sensor assemblies.

Advantageously, each motion sensor assembly is independent of the other motion sensor assemblies. In this manner, the reception by a base station of the system of all the measurement data signals from the sensor assemblies makes it possible to precisely and automatically determine a time of flight and a precise position of a competitor on the trampoline bed during the competition. Points are automatically awarded by the system and without the aid of a judge. In this manner, at the end of his or her performance, each competitor will have a precisely provided number of points following the calculation in the base station, which includes a computer.

Advantageously, once the sensor assemblies are activated and possibly initialized at the start of the competition, it is possible to obtain precisely all the measurements for the allocation of points during the competition, particularly in a computer wirelessly connected to the sensor assemblies.

To this end, the invention also concerns a system for measuring physical parameters in a trampoline competition for implementation of the measuring method which includes the features defined in the independent claim 10.

Specific embodiments of the measuring system are defined in the dependent claims 11 to 14.

BRIEF DESCRIPTION OF THE DRAWINGS

The objects, advantages and features of the method and system for measuring physical parameters in a trampoline competition according to the invention will appear more clearly in the following description of at least one non-limiting embodiment, illustrated by the drawings, in which.

DETAILED DESCRIPTION OF THE INVENTION

In the following description, all those elements of a system for measuring physical parameters in a trampoline competition which are well known to those skilled in the art in this technical field will be described only in a simplified manner.

Figure 1:
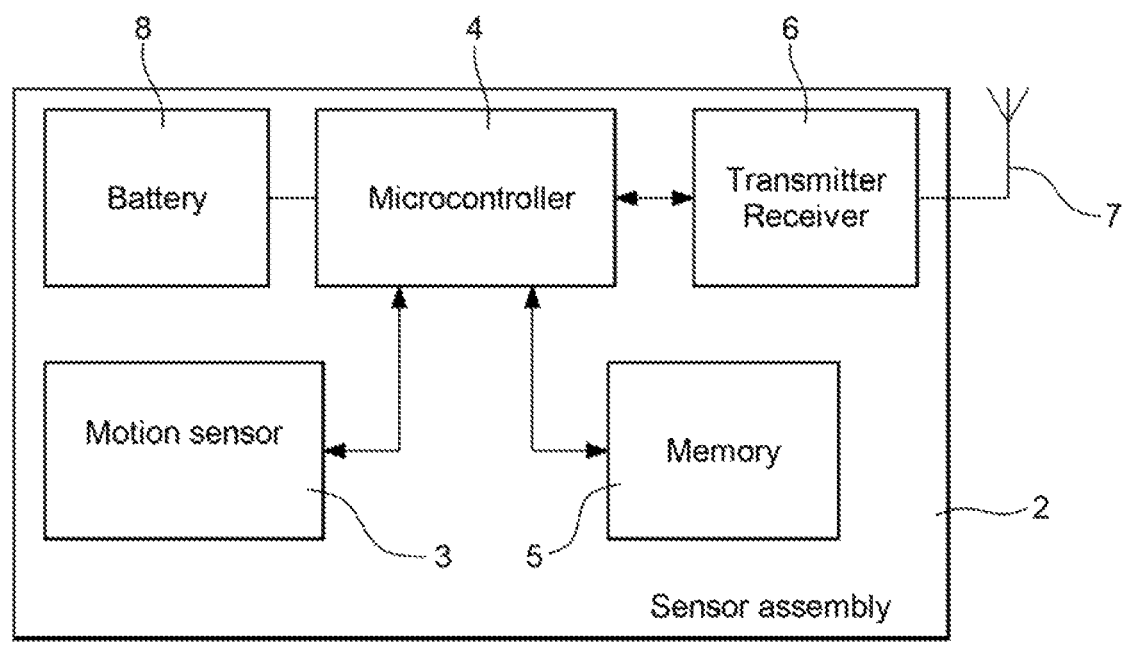
FIG. 1 represents a simplified embodiment of a motion sensor assembly for the system for measuring physical parameters in a trampoline competition according to the invention.

FIG. 1 schematically represents the components of a motion sensor assembly 2 for use in a system for measuring physical parameters in a trampoline competition. Sensor assembly 2 mainly comprises at least one motion sensor 3, connected to a processing unit 4, which may be a processor or preferably a microcontroller 4, in order to process the measurement data from motion sensor 3 over time. Sensor assembly 2 further includes transmitting means, such as a transmitter, or even transmitting and receiving means, such as a transmitter/receiver 6 connected to microcontroller 4 for the transmission of measurement data signals by an antenna 7, which may also be used to receive configuration or control or parametrization signals from a base station. Sensor assembly 2 may also comprise a memory 5 for storing measurement data particularly during the competition. This memory 5 may be volatile or nonvolatile, such as a Flash memory. A power source such as a battery 8 may also be provided for the electrical supply of the components of sensor assembly 2.

Motion sensor 3 may be composed of at least one accelerometer and/or a gyroscope. Preferably, motion sensor 3 can be composed of a triaxial accelerometer, a triaxial gyroscope and a triaxial magnetometer. An execution algorithm is stored in memory 5 or directly in microcontroller 4 to detect whether or not the competitor is in the air during the competition. Through a combination of signals from the gyroscope and the accelerometer at a defined frequency between 1 kHz and 10 kHz, preferably 2 kHz, clocked by microcontroller 4, it is possible to obtain very good accuracy for determining the competitor's time of flight (ToF) on a trampoline without delay during the competition.

Figure 2:
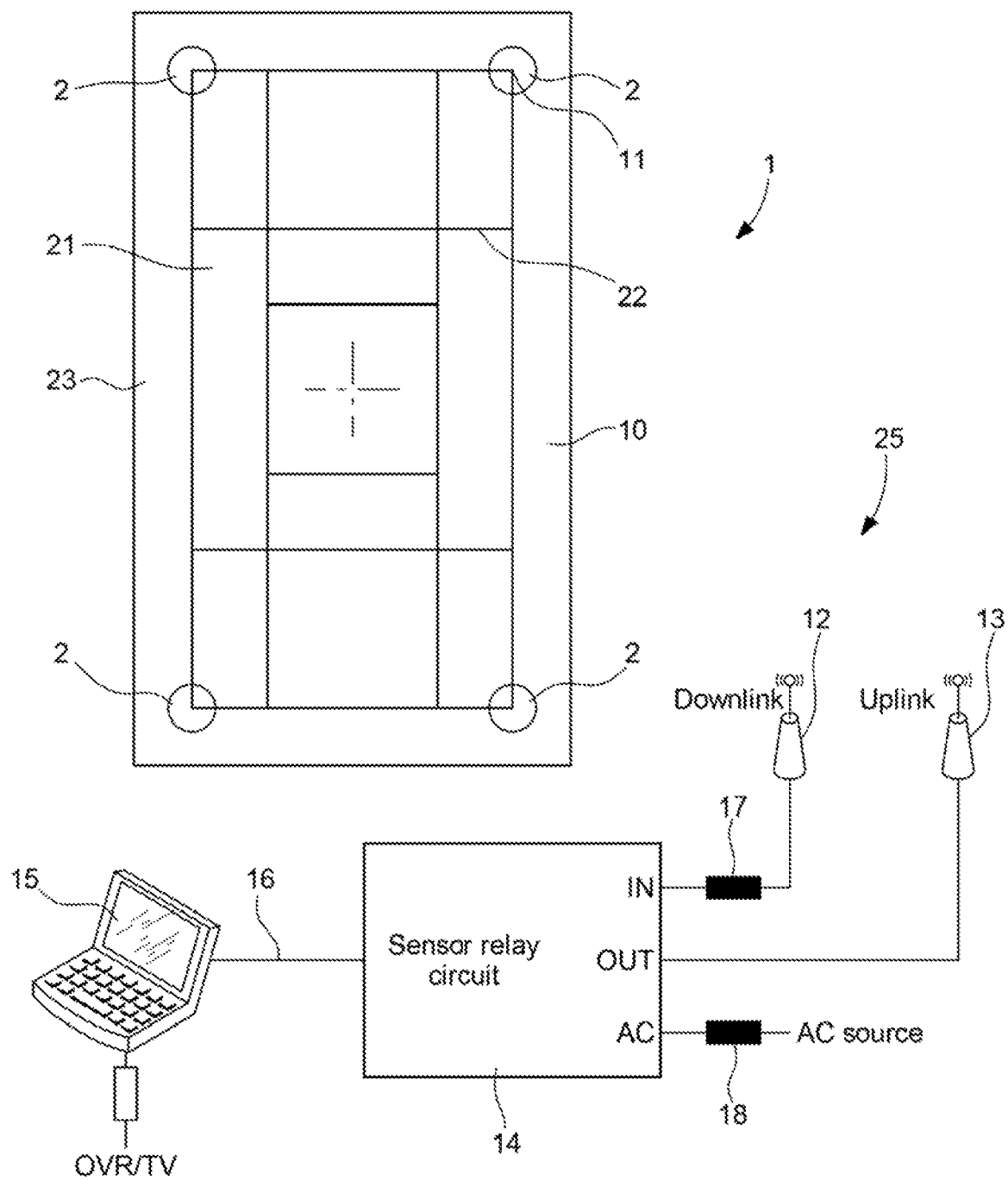
FIG. 2 represents a simplified embodiment of a system for measuring physical parameters in a trampoline competition according to the invention.

For the method for measuring physical parameters on the trampoline particularly during a competition, reference is made to the measuring system 1 presented in FIG. 2. The measuring system can be activated at the start of a trampoline competition and allows all the measurements to be made automatically for each competitor and a result to be provided or a personal number of points to be allocated to the competitor.

Measuring system 1 includes several motion sensor assemblies 2 arranged in different positions on a trampoline 10, for example on corners 11, for example at the four corners 11 of the rectangular trampoline 10 seen in a top view. A sensor assembly 2 is preferably provided at each corner 11 of trampoline 10, i.e. at the connection of a bed 21 to a frame 23 around the trampoline, which is itself fixed to legs (not represented) to hold the trampoline at a distance from the ground. Bed 21 is generally connected to the surrounding frame 23 by several helical springs (not represented). When a competitor bounces on bed 21 of trampoline 10, the motion sensor of each sensor assembly 2 detects a motion or a variation in motion to provide measurement data over time. Each sensor assembly 2 is independent of every other sensor assembly 2 in order to provide measurement data independently of the other sensor assemblies 2.

It is to be noted that each motion sensor assembly 2 is preferably arranged at a respective corner 11 of bed 21 directly where the helical springs are connected to bed 21. Another end of the springs is directly connected to frame 23 of trampoline 10.

By means of the arrangement of motion sensor assemblies 2 on bed 21 of trampoline 10, it is also possible to precisely measure horizontal displacement by taking the measurements of each activated sensor of sensor assemblies 2 independently of one another. Each sensor assembly 2 can transmit its identification number in the data signal to distinguish it from the other sensor assemblies 2.

Once activated for the competition, the microcontrollers of the assemblies are clocked, for example at a frequency of 2 kHz, to obtain the motion sensor measurements. Each measurement can be stored in the memory of each sensor assembly 2. The measurement data signals can be transmitted from a transmitter of each sensor assembly 2 with identification of the sensor assembly 2 for a base station 25, which includes a computer 15 of measuring system 1 via a receiving antenna 12 (Downlink). This receiving antenna 12 can be connected to a sensor relay circuit 14 of base station 25. This circuit 14 receives the measurement signals from receiving antenna 12 at an input IN. These received signals can also be filtered by a filter 17 according to the country of the competition. A wired connection 16, for example, can also be made between relay circuit 14 and computer 15 for overall management of the competition and of all the registered competitors. Computer 15 can also control a display of the results by OVR/TV signals or transmit information via a computer or television network.

During the competition, computer 15 can receive data signals from each active sensor assembly 2 to precisely calculate the position of the competitor on trampoline bed 21. Points are awarded according to the place of contact on the bed for each of the competitor's jumps, taking account of the position of red lines 22 marked on bed 21. The measurements of the motion sensors of sensor assemblies 2 are clearly differentiated according to the position of contact of the competitor on bed 21 for the precise, automatic determination of points. Further, computer 15 can also determine the time of flight of the competitor to award other points to the competitor during his competition performance. However, the time of flight can also be directly determined in each sensor assembly 2 prior to transmission of the measurement data signal.

It is also to be noted that each time that the competitor touches or leaves the trampoline, motion sensor assemblies 2 also send a time stamp calculated in the air in the data signals. An identification number of the sensor assembly 2 can also be inserted in the transmitted data signals, which are generally low frequency signals. Computer 15 receives the time stamps and converts them to the corresponding time of day.

Commands can be sent from computer 15 to sensor assemblies 2. These control signals are transmitted by a transmitting antenna 13 (Uplink), which is connected to an output OUT of relay circuit 14. These control signals are received by all the sensor assemblies 2. A time base of each microcontroller can be adapted following a synchronization transmitted by computer 15. This relay circuit 14 can also be electrically powered by a connection to an external AC source, i.e. to the electrical grid with a transformer 18 at the AC input of relay circuit 14.

The control signals and their effect on each sensor assembly 2 are as follows:

Selection of a competition mode, wherein sensor assemblies 2 and the detection algorithms are activated.

Selection of a standby mode, wherein the sensors and detection algorithms are deactivated, but the other components of each sensor assembly 2 are on.

Selection of a shutdown mode, wherein each sensor assembly 2 is off.

Memory erasure, wherein all the stored data of sensor assemblies 2 is erased prior to a new competitor or a new competition.

It is also to be noted that all the sensor assemblies 2 periodically send a status signal, for example every second, which is received by antenna 12 and transferred to computer 15. The status of sensor assemblies 2 can then be viewed on computer 15, particularly the status of the motion sensors, the battery level, the memory storage space and other statuses.

When the sensor assemblies 2 are in competition mode, a detection algorithm is activated to detect when a person or a competitor comes into contact with bed 21 and when the person or competitor takes off. Each sensor assembly 2 performs its own detection independently of the other sensor assemblies 2. At each detection of landing or take off, a data signal is sent with the calculated time. All the data signals are received by receiving antenna 12 and transmitted to computer 15. For each jump of the person or competitor, the computer processes the information received from the various motion sensors to calculate a single time of flight and a precise position on the trampoline.

From the description that has just been given, several variants of the method or system for measuring physical parameters in a trampoline competition can be devised by those skilled in the art without departing from the scope of the invention defined by the claims. Each sensor assembly could also be powered by low frequency communication signals received by the receiving antenna of each sensor assembly. The time base of each microcontroller can be calibrated before the start of each competition. Measurement of physical parameters could be carried out for two competitors at the same time, each in competition on a respective trampoline, with mutually independent sensor assemblies.

The invention claimed is:

1. A method for measuring physical parameters in a trampoline competition, with a measuring system that includes several sensor assemblies arranged in different positions on a trampoline, the sensor assemblies being independent of one another, for communication of data signals to a base station of the measuring system, each sensor assembly comprising a motion sensor, a processing unit and means for transmitting and receiving data or control signals, the data signals containing the measurements made by the motion sensor, wherein the method includes the steps of:
   for a competition mode, activating each sensor assembly,
   measuring any motion or variations in motion over time via the motion sensor of each sensor assembly following jumps performed by a competitor on a bed of the trampoline,
   processing one or more of the measurement signals from the motion sensor in the processing unit, which is a microcontroller, of each sensor assembly, a time base of each microcontroller of the sensor assemblies being adapted as a result of a synchronization transmitted by the base station in communication with each sensor assembly,
   transmitting measurement signals clearly defined in time from each sensor assembly to the base station of the measuring system,
   automatically determining in the base station following the various measurements received over time from each sensor assembly, a time of flight for each of the competitor's jumps, and a position of contact of the competitor on the bed in order to award points to the competitor for the execution of a determined number of jumps during the competition,
   wherein each motion sensor comprises at least an accelerometer and a gyroscope, and
   wherein the time of flight of the competitor is determined by each sensor assembly prior to transmission of the measurement data signals.

2. The measuring method according to claim 1, wherein each sensor assembly is activated by a control signal transmitted by a transmitting antenna from the base station and received by an antenna of the transmitting and receiving means of each sensor assembly.

3. The measuring method according to claim 1, wherein the measuring system comprises at least four sensor assemblies each respectively arranged at one of the four corners of the bed of the trampoline, and the processing unit, which is a microcontroller, wherein, in competition mode, each motion sensor of the sensor assemblies makes measurements at a defined frequency between 1 kHz and 10 kHz clocked by the microcontroller, and wherein transmission of the measurement data signals to the base station occurs with every measurement made to determine in the base station the time of flight of each of the competitor's jumps, and the position of contact of the competitor on the bed of the trampoline.

4. The measuring method according to claim 3, wherein each sensor assembly transmits data signals with a time stamp for each measurement, which are received by a receiving antenna of the base station.

5. The measuring method according to claim 3, wherein each sensor assembly transmits data signals with an identification number, which are received by a receiving antenna of the base station in order to allow a computer of the base station to precisely determine the position of contact of the competitor on the bed of the trampoline by means of the measurements of the four sensor assemblies combined.

6. The measuring method according to claim 1, wherein the various measurements made over time by the motion sensor of each sensor assembly are stored in a memory connected to the processing unit, and wherein a detection algorithm is also stored in the memory or in the processing unit, which is a microcontroller, to detect, during the competition, whether or not the competitor is in the air during each of the competitor's jumps.

7. The measuring method according to claim 1, wherein each sensor assembly comprises a memory for storing the motion sensor measurements, a battery for the electrical supply of the electronic components of the sensor assembly, characterized in that each sensor assembly, which comprises wireless signal transmitting and receiving means, periodically sends a status signal, which is received by an antenna of the base station and transferred to a computer of the base station, which can recognize the status of the motion sensor, the battery level and the memory storage space.

8. The measuring method according to claim 1, wherein each sensor assembly comprises wireless signal transmitting and receiving means for receiving control signals transmitted by a transmitting antenna of the base station, characterized in that the received control signals allow selection of a competition mode, wherein the sensor assemblies and detection algorithms are activated for the competition, selection of a standby mode wherein only the motion sensors of the sensor assemblies and detection algorithms are deactivated, selection of a shutdown mode, wherein each sensor assembly is off, and a memory erasure mode, wherein all the stored data of the sensor assemblies is erased before a new competition.

9. A system for measuring physical parameters in a trampoline competition for implementation of the measuring method according to claim 1, wherein the measuring system comprises several sensor assemblies arranged in different positions on a trampoline, the sensor assemblies being independent of one another, for communication of data signals to a base station of the measuring system, each sensor assembly comprising a motion sensor, a processing unit, which is a microcontroller with a time base adapted following a synchronization transmitted by the base station, and data or control signal transmitting and receiving means, the data signals containing the measurements made by the motion sensor.

10. The measuring system according to claim 9, wherein the microcontroller with a time base of each assembly is arranged to clock the measurements made by the motion sensor, which comprises at least the accelerometer and the gyroscope.

11. The measuring system according to claim 9, wherein each sensor assembly comprises a memory for storing the various measurements of the motion sensor, and a detection algorithm.

12. The measuring system according to claim 11, wherein each measurement made by the motion sensor is stored in the memory with a time stamp.

13. The measuring system according to claim 9, wherein a battery is provided in each sensor assembly for the electrical supply of the electronic components, and in that the motion sensor of each sensor assembly is composed of a triaxial accelerometer, a triaxial gyroscope, and a triaxial magnetometer.

\* \* \* \* \*